(12) United States Patent
Ding et al.

(10) Patent No.: US 10,535,575 B2
(45) Date of Patent: Jan. 14, 2020

(54) INTERPOSER, METHOD OF MANUFACTURING INTERPOSER, AND METHOD OF MANUFACTURING SEMICONDUCTOR PACKAGE

(71) Applicant: SAMSUNG ELECTRONICS CO., LTD., Suwon-si (KR)

(72) Inventors: Shaofeng Ding, Suwon-si (KR); Kyoung-woo Lee, Hwaseong-si (KR); In-hwan Kim, Gyeongsan-si (KR); Jong-woon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 60 days.

(21) Appl. No.: 15/997,131

(22) Filed: Jun. 4, 2018

(65) Prior Publication Data

US 2019/0131194 A1    May 2, 2019

(30) Foreign Application Priority Data

Nov. 2, 2017    (KR) .................. 10-2017-0145376

(51) Int. Cl.
| | |
|---|---|
| *H01L 21/768* | (2006.01) |
| *H01L 21/66* | (2006.01) |
| *H01L 23/498* | (2006.01) |
| *H01L 25/065* | (2006.01) |

(52) U.S. Cl.
CPC ........ *H01L 22/34* (2013.01); *H01L 21/76802* (2013.01); *H01L 22/20* (2013.01); *H01L 23/49827* (2013.01); *H01L 25/0657* (2013.01); *H01L 2225/06513* (2013.01); *H01L 2225/06517* (2013.01); *H01L 2225/06541* (2013.01); *H01L 2225/06596* (2013.01)

(58) Field of Classification Search
CPC ... H01L 2924/15311; H01L 2924/1434; H01L 2924/1431; H01L 2225/107; H01L 2225/1058; H01L 2225/1023; H01L 25/105; H01L 22/34
See application file for complete search history.

(56) References Cited

U.S. PATENT DOCUMENTS

| | | |
|---|---|---|
| 8,114,688 B2 | 2/2012 | Lehr |
| 8,956,889 B2 | 2/2015 | Lin et al. |
| 2003/0213953 A1 | 11/2003 | Sohn et al. |
| 2009/0033353 A1 | 2/2009 | Yu et al. |
| 2012/0249176 A1 | 10/2012 | Chien et al. |

(Continued)

FOREIGN PATENT DOCUMENTS

| | | |
|---|---|---|
| JP | 2001-291754 A | 10/2001 |
| JP | 2004-228452 A | 8/2004 |
| KR | 10-1034634 B1 | 5/2011 |

*Primary Examiner* — Mohammed R Alam
(74) *Attorney, Agent, or Firm* — Sughrue Mion, PLLC

(57) ABSTRACT

An interposer includes a substrate having a mounting area and a test area, first conductive plugs separate from each other, the first conductive plugs being disposed along a first direction and into the test area of the substrate, a first line pattern group including first non-conductive patterns disposed on first centers of the first conductive plugs, and first conductive patterns disposed to bridge first peripheries of a first adjacent pair of the first conductive plugs, and first pads connected to the first conductive patterns at both first ends of the first line pattern group.

19 Claims, 14 Drawing Sheets

(56) References Cited

U.S. PATENT DOCUMENTS

2013/0342231 A1* 12/2013 Alfano ............... G01R 31/2884
324/750.16
2014/0191410 A1* 7/2014 Leatherman ............ H01L 22/34
257/774
2015/0087089 A1 3/2015 Wang et al.

* cited by examiner

INTERPOSER, METHOD OF MANUFACTURING INTERPOSER, AND METHOD OF MANUFACTURING SEMICONDUCTOR PACKAGE

CROSS-REFERENCE TO RELATED APPLICATION

This application claims priority from Korean Patent Application No. 10-2017-0145376, filed on Nov. 2, 2017, in the Korean Intellectual Property Office, the disclosure of which is incorporated herein by reference in its entirety.

BACKGROUND

1. Field

Apparatuses and methods consistent with example embodiments relate to an interposer, a method of manufacturing the interposer, and a method of manufacturing a semiconductor package, and more particularly, to an interposer including a test structure capable of rapidly measuring electric open/short defects, a method of manufacturing the interposer, and a method of manufacturing a semiconductor package.

2. Description of Related Art

As a semiconductor is highly integrated, such a highly integrated semiconductor is not frequently accommodated in a printed circuit board (PCB). To solve the problem, a semiconductor package structure in which an interposer is interposed between a semiconductor chip and a package substrate may be used. An interposer using a silicon substrate may be advantageous for fine processing. However, because it may be difficult and costly to manufacture the interposer using the silicon substrate, there may be problems to be solved to mass produce interposers using silicon substrates at small cost.

SUMMARY

According to example embodiments, there is provided an interposer including a substrate having a mounting area and a test area, first conductive plugs separate from each other, the first conductive plugs being disposed along a first direction and into the test area of the substrate, a first line pattern group including first non-conductive patterns disposed on first centers of the first conductive plugs, and first conductive patterns disposed to bridge first peripheries of a first adjacent pair of the first conductive plugs, and first pads connected to the first conductive patterns at both first ends of the first line pattern group.

According to example embodiments, there is provided a method of manufacturing an interposer, the method including providing a substrate, forming, in the substrate, first through silicon vias (TSVs), forming a first line pattern group including first non-conductive patterns disposed on first centers of the first TSVs, and first conductive patterns disposed to bridge first peripheries of a first adjacent pair of the first TSVs, and forming first pads connected to both first ends of the first line pattern group.

According to example embodiments, there is provided a method of manufacturing a semiconductor package, the method including providing a substrate having a mounting area and a test area, forming, in the test area of the substrate, first through silicon vias (TSVs), forming a first line pattern group including first non-conductive patterns disposed on first centers of the first TSVs, and first conductive patterns disposed to bridge first peripheries of a first adjacent pair of the first TSVs, forming first pads connected to both first ends of the first line pattern group, forming, in the substrate, second TSVs, forming a second line pattern group including second non-conductive patterns disposed on second centers of the second TSVs, and second conductive patterns disposed to bridge second peripheries of a second adjacent pair of the second TSVs, forming second pads connected to both second ends of the second line pattern group, generating first data by providing an electric signal to the first pads, generating second data by providing a measuring signal to the second pads, detecting whether the first line pattern group is defective, based on the first data and the second data, and mounting a semiconductor chip on the mounting area.

According to example embodiments, there is provided a interposer including a substrate having a mounting area and a test area, first conductive plugs separate from each other, the first conductive plugs being disposed along a first direction and into the test area of the substrate, a first line pattern group including first non-conductive patterns disposed on first centers of the first conductive plugs, and first conductive patterns disposed on the first conductive plugs and between the first non-conductive patterns, first pads disposed on both first ends of the first line pattern group, second conductive plugs separate from each other, the second conductive plugs being disposed along the first direction and into the test area of the substrate, and the second conductive plugs being disposed apart from the first conductive plugs in a second direction perpendicular to the first direction, a second line pattern group including second non-conductive patterns disposed on second centers of the second conductive plugs, and second conductive patterns disposed on the second conductive plugs and between the second non-conductive patterns, and second pads disposed on both second ends of the second line pattern group.

DETAILED DESCRIPTION OF THE EXAMPLE EMBODIMENTS

Figure 1:
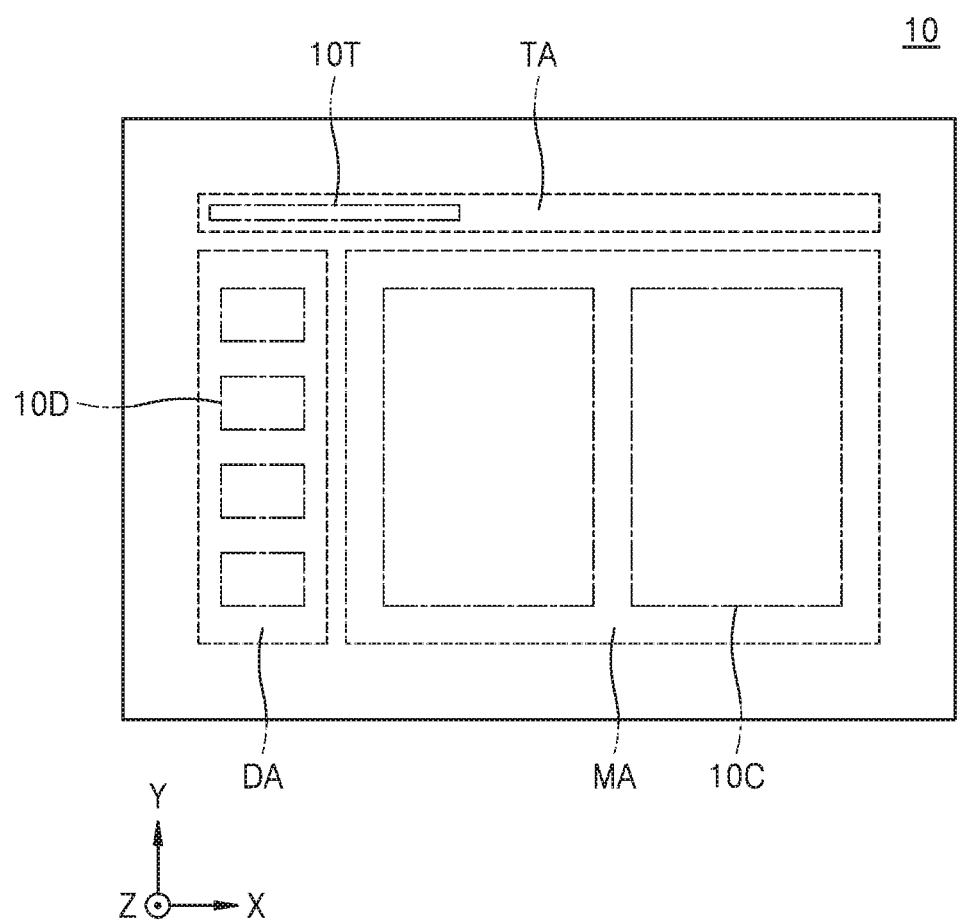
FIG. 1 is a plan layout diagram of an interposer according to example embodiments.

FIG. 1 is a plan layout diagram of an interposer according to example embodiments.

Referring to FIG. 1, an interposer 10 may include a mounting area MA, a device area DA, and a test area TA.

In the mounting area MA, at least one semiconductor chip 10C may be mounted on the interposer 10 in horizontal directions (X and Y directions) or a vertical direction (a Z direction). The semiconductor chip 10C may be directly mounted on the interposer 10 by micro-bumps.

The semiconductor chip 10C may be a processor unit. The semiconductor chip 10C may be, for example, a microprocessor unit (MPU) or a graphics processor unit (GPU). In example embodiments, the semiconductor chip 10C may include a logic chip or a plurality of dynamic random access memory (DRAM) chips laminated on the logic chip.

In addition, the semiconductor chip 10C may include a memory device. For example, the memory device may include a high bandwidth memory. In example embodiments, the memory device may include a non-volatile memory. The non-volatile memory may be phase-change random access memory (PRAM), magnetoresistive RAM (MRAM), ferroelectric RAM (FeRAM), or resistive RAM (RRAM). However, the inventive concept is not limited thereto. In other example embodiments, the memory device may include a volatile memory such as DRAM or SRAM.

In addition, in the mounting area MA, the plurality of semiconductor chips 10C may be laminated in the vertical direction (the Z direction). The plurality of semiconductor chips 10C may include a through silicon via (TSV) and may be electrically connected to each other through the TSV. The plurality of semiconductor chips 10C may be electrically connected to the interposer 10 through the TSV.

A semiconductor device 10D for the interposer 10 may be included in the device area DA. In example embodiments, the semiconductor device 10D may be a semiconductor integrated circuit including at least one among a transistor, a diode, a capacitor, and a resistor. In other example embodiments, the device area DA may overlap the mounting area MA. As occasion demands, the device area DA may be omitted.

The test area TA may include a test structure 10T. The test structure 10T is for measuring an electric characteristic of the interposer 10. Data obtained through a test of the test structure 10T may be used for solving problems of manufacturing processes of the interposer 10. That is, the problems of the processes may be solved by analyzing the measured electric characteristic and determining whether the processes are properly performed. In addition, the data obtained through the test is determined and the interposer 10 including defective data may be isolated from the interposer 10 including normal data and may be processed.

To grasp electric characteristics of various structures that form the interposer 10, the test area TA including the test structure 10T may be formed outside the interposer 10. Because the test structure 10T may be formed to have the same elements as the various structures formed in the mounting area MA and the device area DA through the same process, a result of measuring the electric characteristic of the test structure 10T may be the same as a result of directly measuring the electric characteristics of the various structures formed in the mounting area MA and the device area DA. Therefore, the electric characteristic of the interposer 10 may be obtained by testing the test structure 10T.

Figure 2:
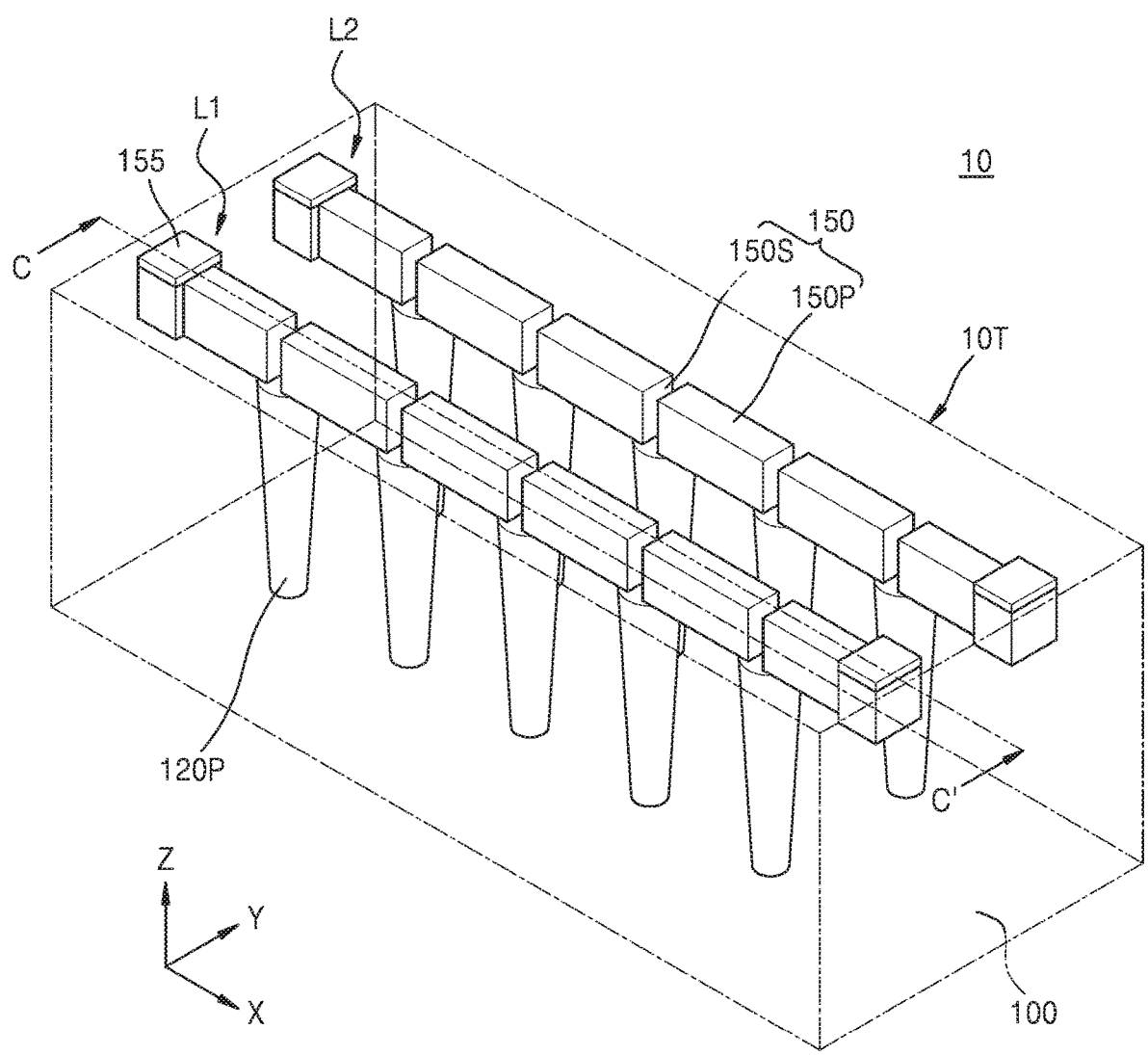
FIG. 2 is a schematic perspective view illustrating a test structure formed in a test region of an interposer, according to example embodiments.

FIG. 2 is a schematic perspective view illustrating a test structure formed in a test region of an interposer, according to example embodiments.

Referring to FIG. 2, the test structure 10T including conductive plugs 120P, line pattern groups 150, and pads 155 is formed on a substrate 100.

The conductive plugs 120P are separate from each other in a first direction (an X direction) by a predetermined first distance and may be separate from each other in a second direction (a Y direction) perpendicular to the first direction (the X direction) by a predetermined second distance. The conductive plug 120P may correspond to the TSV in the mounting area MA (refer to FIG. 1).

The line pattern group 150 may have a structure in which a non-conductive space area 150S (or a non-conductive pattern area) arranged in the center of the conductive plug 120P and a conductive pattern area 150P arranged by bridging peripheries of the two adjacent conductive plugs 120P are alternately repeated. A level of a lower surface of the conductive pattern area 150P may be the same as a level of an upper surface of the conductive plug 120P.

The non-conductive space areas 150S and the conductive pattern areas 150P are alternately and repeatedly arranged in the first direction (the X direction), and the conductive pattern areas 150P and the conductive plugs 120P may be alternately and repeatedly arranged in the first direction (the X direction).

A length of the non-conductive space area 150S in the first direction (the X direction) may be less than a diameter of the conductive plug 120P. A length of the conductive pattern area 150P in the first direction (the X direction) is greater than the first distance of the conductive plug 120P and may be less than the sum of the first distance and the diameter of the conductive plug 120P.

The test structure 10T may include the plurality of line pattern groups 150. The plurality of line pattern groups 150 may be formed of a first line pattern group L1 and a second line pattern group L2. In a test for detecting electric open defect between the conductive plug 120P and the line pattern group 150, one of the first or second line pattern group L1 or L2 may be used. In a test for detecting electric short defect between the substrate 100 and the line pattern group 150, the first and second line pattern groups L1 and L2 may be used, as described in detail below.

The pads 155 may be arranged at both ends of each of the first line pattern group L1 and the second line pattern group L2. The pads 155 may be exposed to the outside and may contact a measuring apparatus. The pads 155 are separate from the conductive pattern area 150P and may be electrically connected to the conductive pattern area 150P through a wiring line. The pad 155 may contact the conductive pattern area 150P or may be a part of the conductive pattern area 150P.

The test structure 10T is not limited to the above elements. In addition, the plurality of line pattern groups 150 are illustrated as the first line pattern group L1 and the second line pattern group L2. However, the number of line pattern groups 150 is not limited thereto.

In the interposer 10, the test structure 10T may be included in the test area TA (refer to FIG. 1). In addition, the interposer 10 may further include a test structure that performs a different function from the test structure 10T.

FIGS. 3A, 3B, 3C, 3D, 3E, 3F, 3G, 3H, 3I, 3J, 3K, 3L, 3M and 3N are views illustrating processes of a method of manufacturing an interposer, according to example embodiments.

Figure 3A:
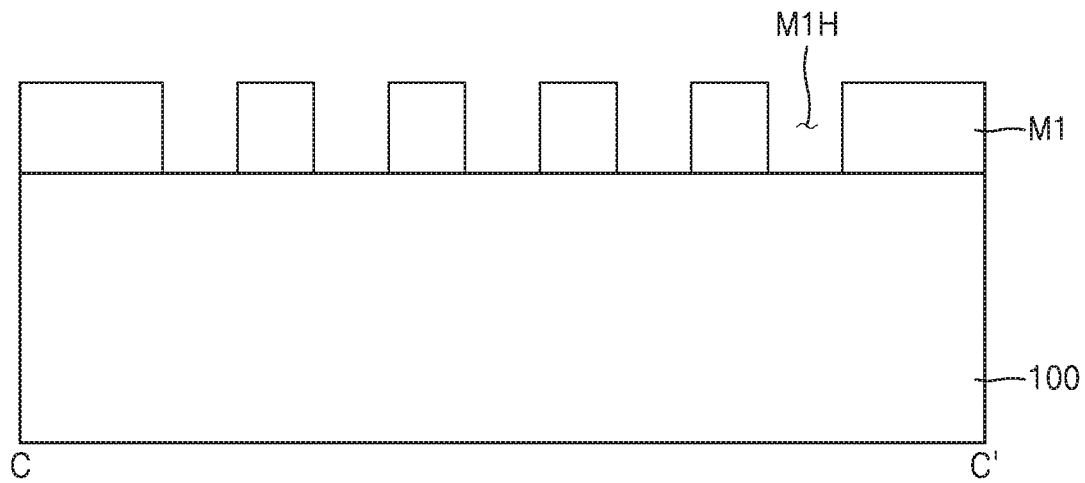
FIGS. 3A, 3B, 3C, 3D, 3E, 3F, 3G, 3H, 3I, 3J, 3K, 3L, 3M and 3N are views illustrating processes of a method of manufacturing an interposer, according to example embodiments.
Figure 3A:
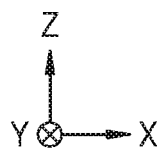
Figure 3B:
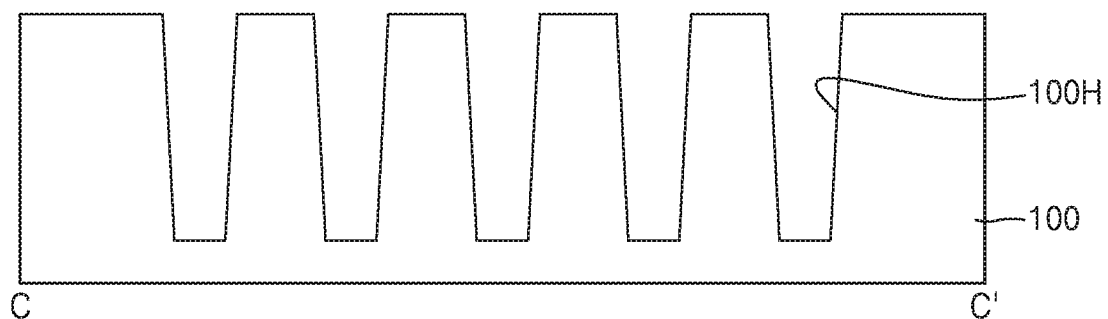
Figure 3B:
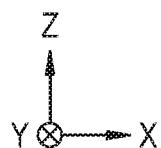
Figure 3C:
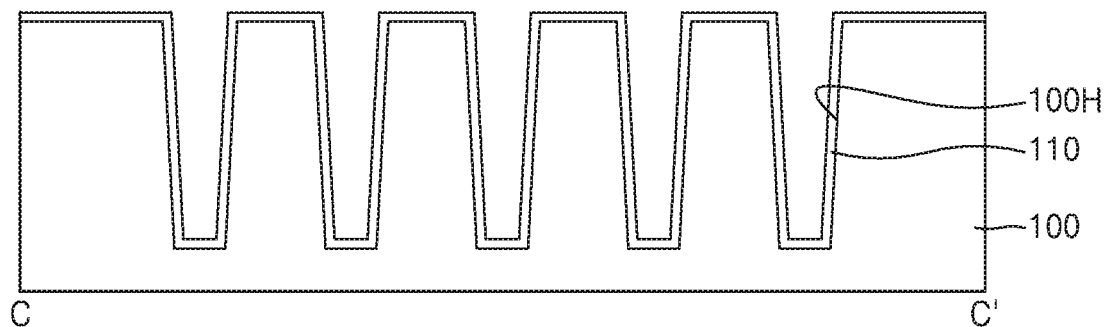
Figure 3C:
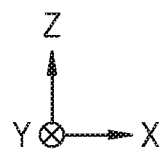
Figure 3D:
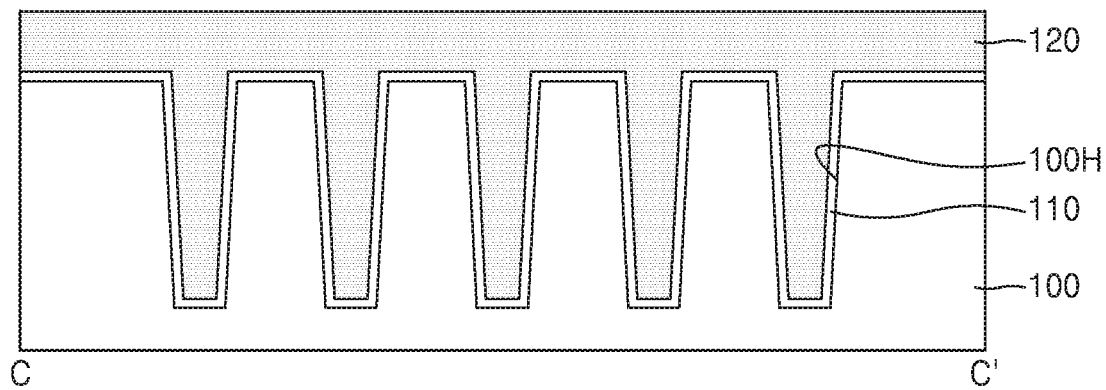
Figure 3D:
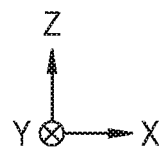
Figure 3E:
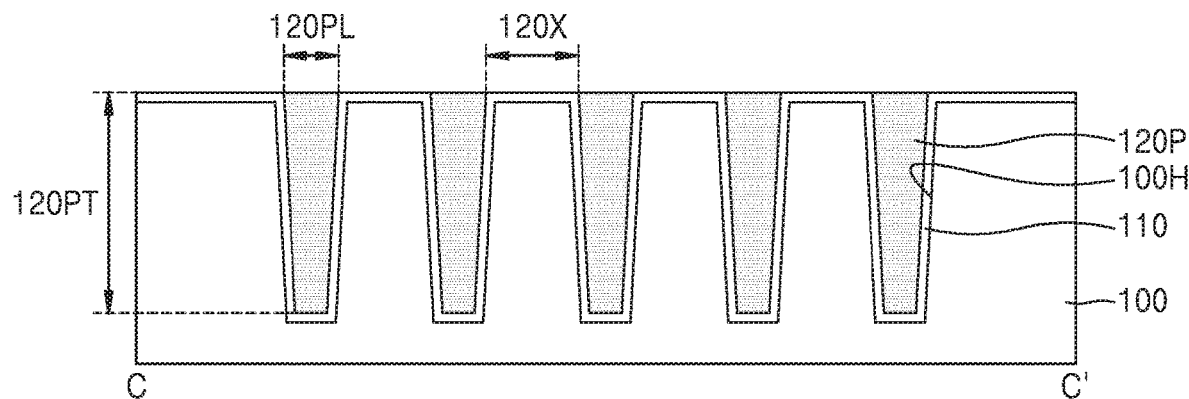
Figure 3E:
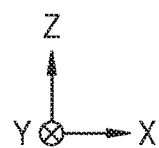
Figure 3F:
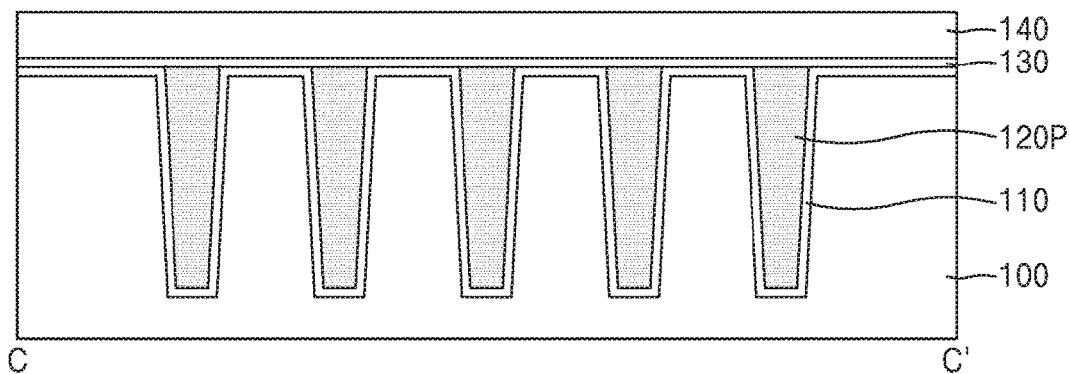
Figure 3F:
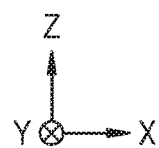
Figure 3G:
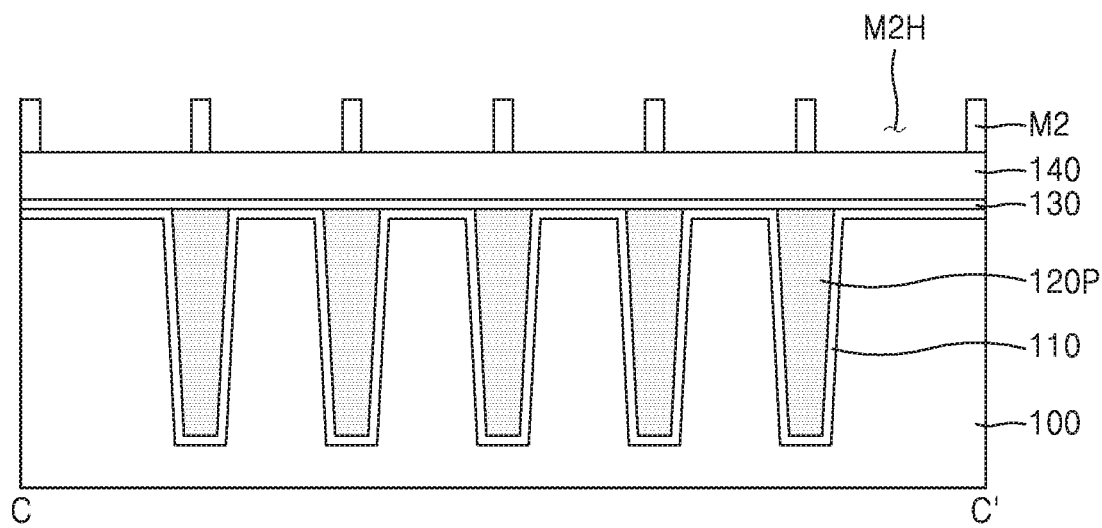
Figure 3H:
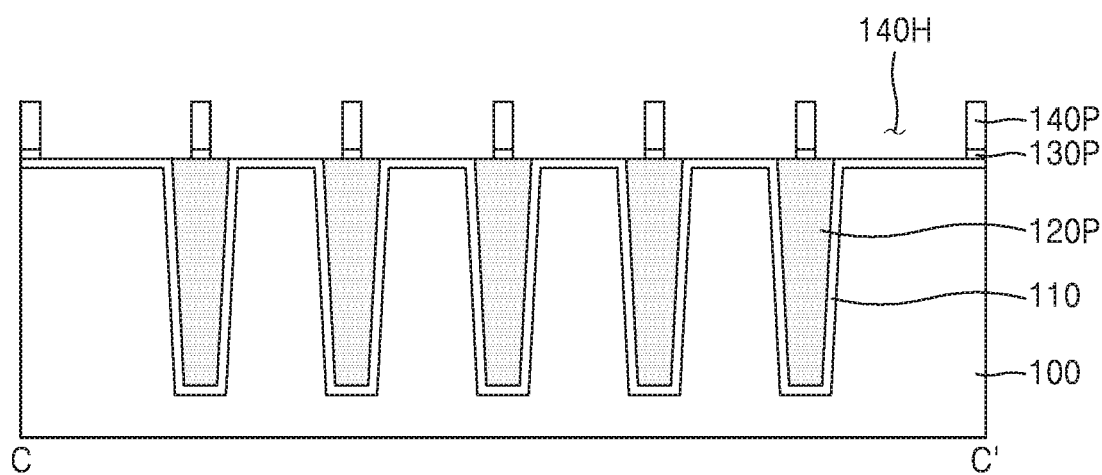
Figure 3I:
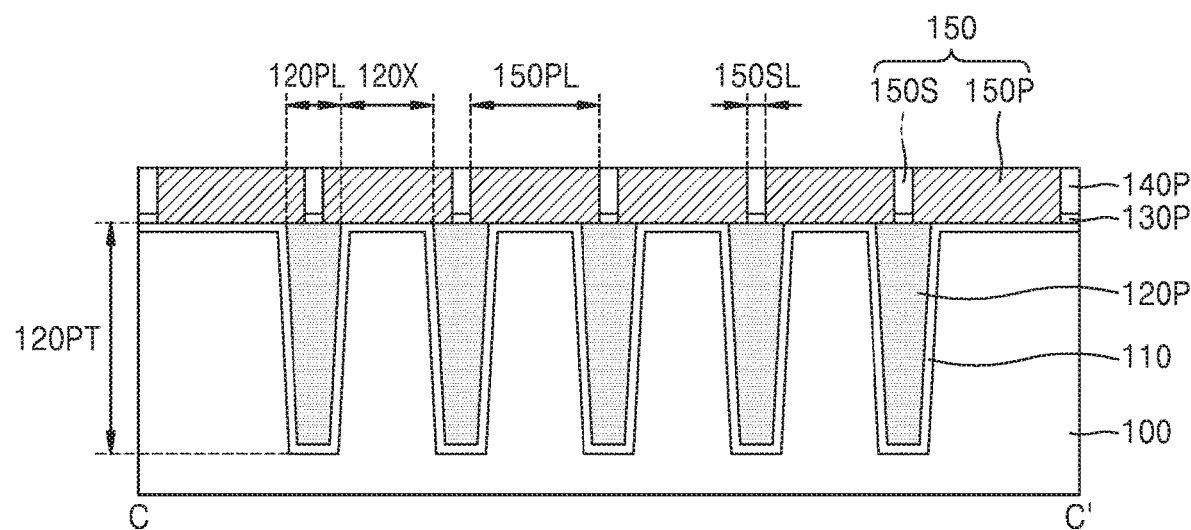
Figure 3I:
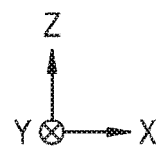
Figure 3J:
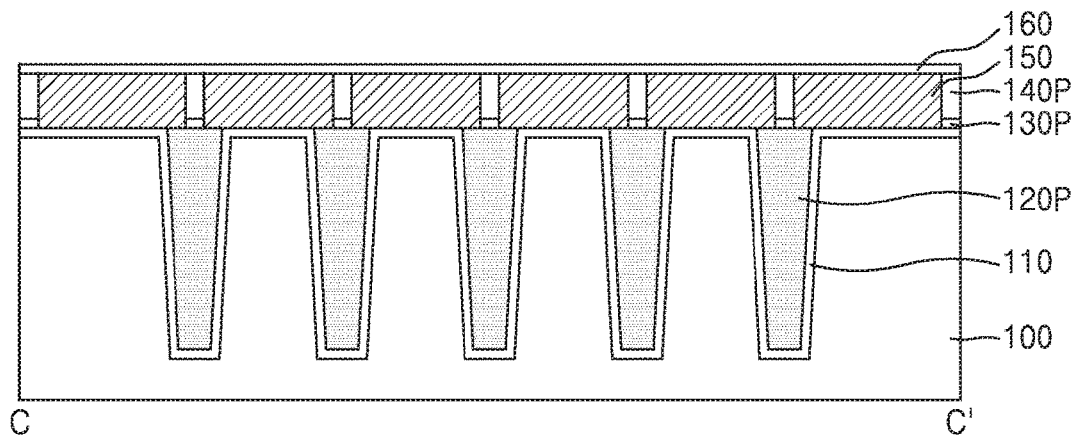
Figure 3J:
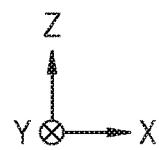
Figure 3K:
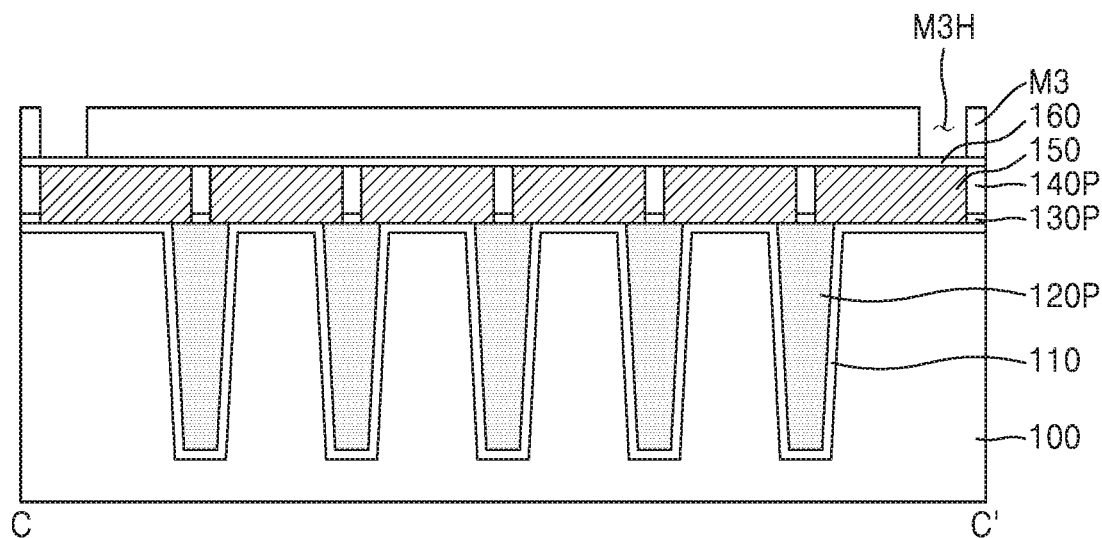
Figure 3L:
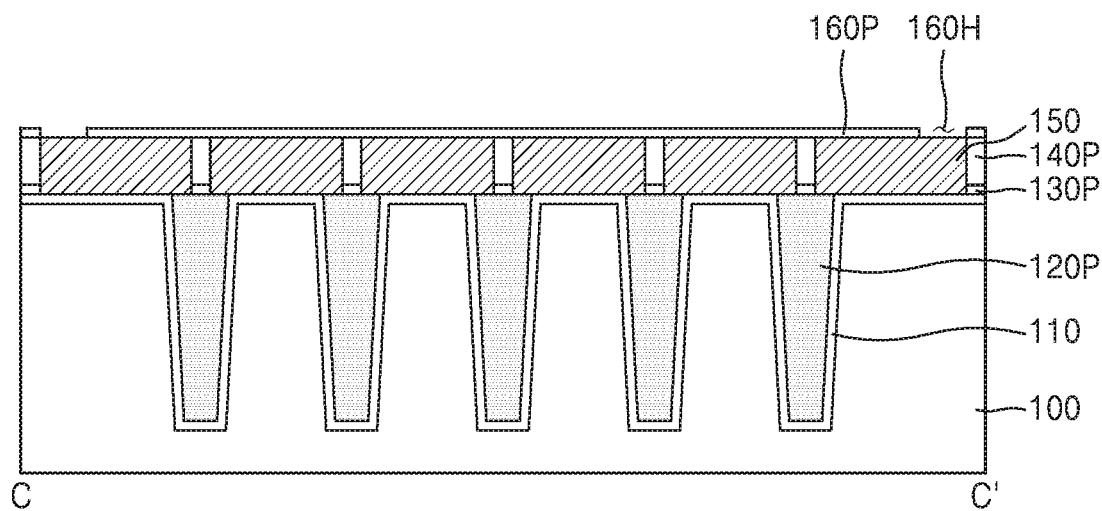
Figure 3M:
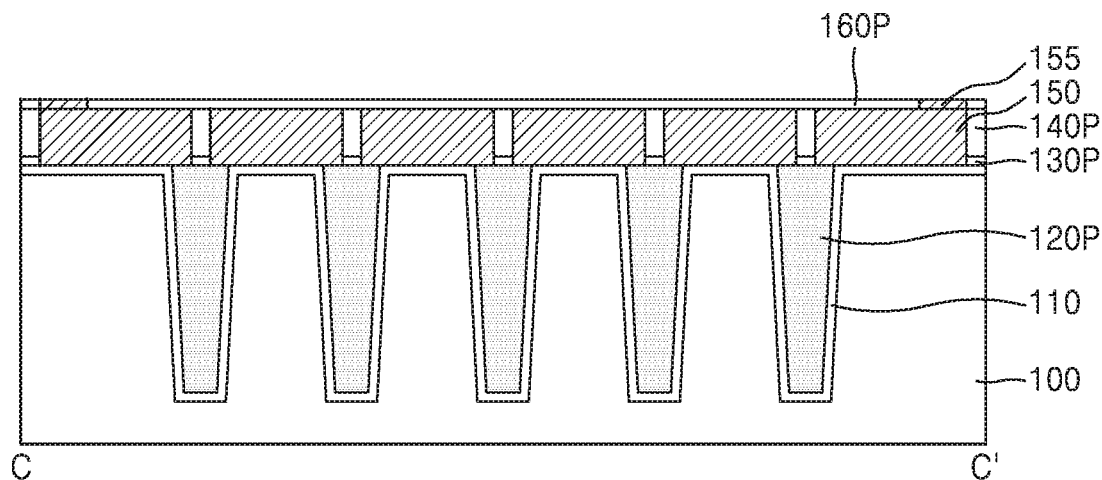
Figure 3M:
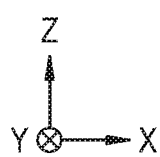
Figure 3N:
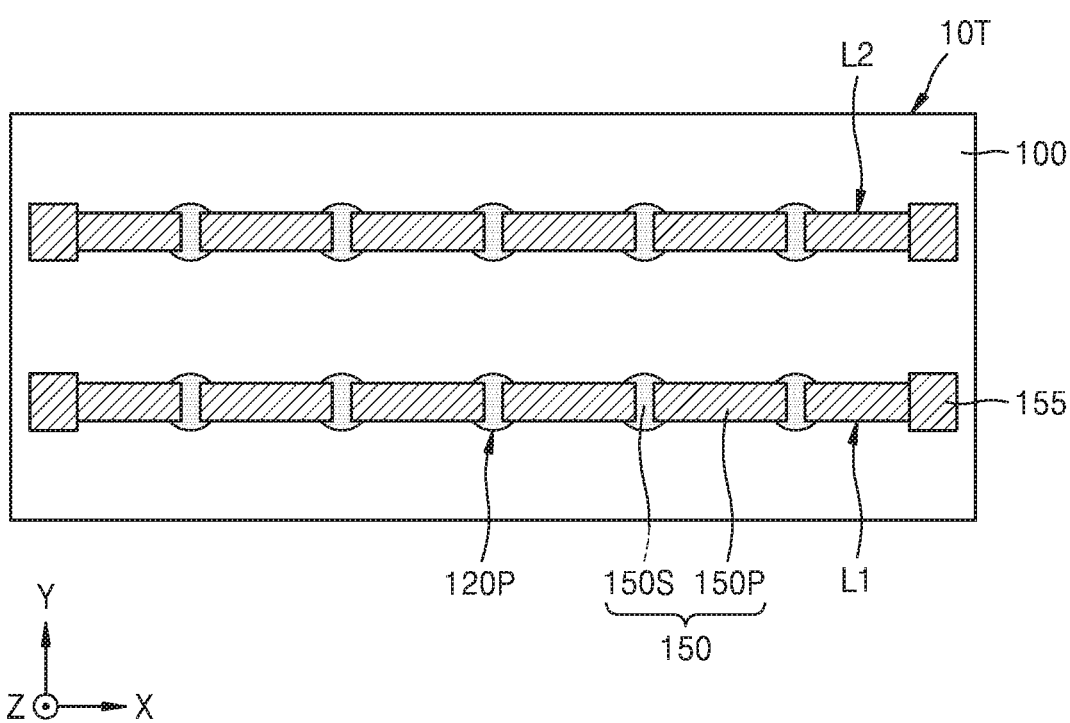

FIGS. 3A to 3M are cross-sectional views illustrating an area corresponding to a cross-section taken along the line C-C' of FIG. 2, and FIG. 3N is a plan view of FIG. 2.

Referring to FIG. 3A, a first mask pattern M1 is formed on the substrate 100.

The substrate 100 may be a silicon wafer including silicon (Si), for example, crystalline Si, polycrystalline Si, or amorphous Si. In addition, the semiconductor device 10D (refer to FIG. 1) may be included in the device area DA (refer to FIG. 1) of the substrate 100. The semiconductor device 10D (refer to FIG. 1) may be a semiconductor integrated circuit including at least one among a transistor, a diode, a capacitor, and a resistor.

In the first mask pattern M1, holes M1H that expose parts of an upper surface of the substrate 100 may be formed. The first mask pattern M1 may be formed of photoresist. Processes of forming the first mask pattern M1 on the substrate 100 will be schematically described. The first mask pattern M1 having the holes M1H is formed by coating a photoresist layer on the substrate 100 and patterning the photoresist layer through an exposing process and a developing process.

In example embodiments, a hard mask layer may be formed under the first mask pattern M1. Any material having sufficient etch selectivity with respect to the substrate 100 may be used as the hard mask layer. The hard mask layer is etched by using the first mask pattern M1 as an etch mask and the holes M1H of the first mask pattern M1 may be transcribed to the hard mask layer.

Referring to FIG. 3B, via holes 100H are formed by etching the substrate 100 by using the first mask pattern M1 (refer to FIG. 3A) as an etch mask.

To form the via holes 100H, an anisotropy etching process or laser drilling technology may be used. For example, the via hole 100H may be formed on the substrate 100 to have a diameter of about 10 μm or no more than 10 μm. In addition, for example, the via hole 100H may be formed to have a depth of about 50 μm to 100 μm from the upper surface of the substrate 100. However, the diameter and the depth of the via hole 100H are not limited thereto. The via hole 100H may have various sizes as occasion demands.

Due to a characteristic of the etching process, the via hole 100H does not have a vertical side wall but may have a tapered side wall so that a width of the via hole 100H is reduced away from the upper surface of the substrate 100 in the third direction (the Z direction). In other example embodiments, the via hole 100H may have a side wall perpendicular to the upper surface of the substrate 100. In this case, the via hole 100H may have a rectangular vertical cross-section.

After the via hole 100H is formed, the upper surface of the substrate 100 is exposed by removing the first mask pattern M1 (refer to FIG. 3A) by ashing and stripping processes.

Referring to FIG. 3C, a first insulating layer 110 that covers internal side walls and lower surfaces of the via holes 100H is formed.

The first insulating layer 110 may be conformally formed along the upper surface of the substrate 100, the internal side walls of the via holes 100H, and the internal lower surfaces of the via holes 100H. In example embodiments, the first insulating layer 110 may be a material among a silicon oxide layer, a silicon nitride layer, a silicon oxynitride layer, and silicon carbide. In other example embodiments, the first insulating layer 110 may be a material among a high density plasma (HDP) oxide layer, tetra ethyl orthosilicate (TEOS) plasma enhanced-TEOS (PE-TEOS), $O_3$-TEOS, undoped silicate glass (USG), phosphor silicate glass (PSG), boro silicate glass (BSG), boro phosphor silicate glass (BPSG), fluorine silicate glass (FSG), spin on glass (SOG), and tonen silazene (TOSZ).

Referring to FIG. 3D, a first metal layer 120 that fills spaces of the via holes 100H is formed on the first insulating layer 110.

To form the first metal layer 120, for example, an electro-plating process may be used. Processes of forming the first metal layer 120 will be schematically described. After forming a metal seed layer, a metal layer is grown from the metal seed layer by the electro-plating process so that the first metal layer 120 that fills the via holes 100H and covers an upper surface of the first insulating layer 110 is formed.

The metal seed layer may be formed of copper (Cu), a Cu alloy, cobalt (Co), nickel (Ni), ruthenium (Ru), Co/Cu, or Ru/Cu. To form the metal seed layer, a physical vapour deposition (PVD) process may be used. The first metal layer 120 may be formed of, for example, Cu, CuSn, CuMg, CuNi, CuZn, CuPd, CuAu, CuRe, CuW, tungsten (W), or a W alloy. However, the inventive concept is not limited thereto.

The electro-plating process may be performed at a temperature of about 10° C. to 65° C. For example, the electro-plating process may be performed at a normal temperature. After the first metal layer 120 is formed, as occasion demands, a resultant material in which the first metal layer 120 is formed may be annealed at a temperature of about 150° C. to 450° C.

Referring to FIG. 3E, the upper surface of the first insulating layer 110 is exposed by polishing the first metal layer 120 (refer to FIG. 3D), using a chemical mechanical polishing (CMP) process or an etch-back process and using the first insulating layer 110 as a stopper.

A part outside the via holes 100H is removed from the first metal layer 120 (refer to FIG. 3D), and the conductive plugs 120P that are parts of the first metal layer 120 (refer to FIG. 3D) are left on the first insulating layer 110 in the via holes 100H.

In example embodiments, the conductive plugs 120P formed in the via holes 100H are thermally processed. Metal particles that form the conductive plug 120P may be grown due to a thermal process and roughness of the exposed surface of the conductive plug 120P may be reduced. The thermal process may be performed, for example, at a temperature of about 400° C. to 500° C. Among the metal particles grown by the thermal process, the parts that protrude to the outside of the via holes 100H may be removed by the CMP process or the etch-back process again.

As a result, in the via holes 100H of the substrate 100, the conductive plugs 120P electrically isolated from the substrate 100 by the first insulating layer 110 are formed. The conductive plug 120P may correspond to the TSV in the mounting area MA (refer to FIG. 1).

The conductive plug 120P may have a first diameter 120PL and a first depth 12OPT. When the conductive plug 120P has a tapered side wall, the first diameter 120PL refers to a diameter of an uppermost surface of the conductive plug 120P. Like the above diameter and depth of the via hole 100H, the conductive plug 120P may be formed to have the first diameter 120PL of about 10 μm or no more than 10 μm.

In addition, the conductive plug 120P may be formed to have the first depth 120PT of about 50 µm to about 100 µm from the upper surface of the substrate 100. However, the first diameter 120PL and the first depth 120PT of the conductive plug 120P are not limited thereto and may have various values as occasion demands.

The conductive plugs 120P may be separate from each other in the first direction (the X direction) by a first distance 120X. The first distance 120X refers to a distance on the upper surface of the conductive plug 120P.

Referring to FIG. 3F, after washing the resultant material of FIG. 3E including the conductive plugs 120P, an etch stop layer 130 and an interlayer insulating layer 140 are sequentially formed.

The etch stop layer 130 may be formed of, for example, a material among a silicon oxide, a silicon nitride, a silicon oxynitride layer, and silicon carbide.

The interlayer insulating layer 140 may be formed of, for example, a material among an HDP oxide layer, TEOS, PE-TEOS, $O_3$-TEOS, USG, PSG, BSG, BPSG, FSG, SOG, and TOSZ.

The material that forms the etch stop layer 130 may be different from the material that forms the interlayer insulating layer 140. In addition, the material that forms the etch stop layer 130 may be different from the material that forms the first insulating layer 110.

The etch stop layer 130 and the interlayer insulating layer 140 may be used as a material layer that forms a boundary of line pattern group holes 140H (refer to FIG. 3H) when the line pattern group holes 140H (refer to FIG. 3H) are formed. A thickness of the interlayer insulating layer 140 may be greater than a thickness of the etch stop layer 130. However, the inventive concept is not limited thereto.

Referring to FIG. 3G, a second mask pattern M2 is formed on the interlayer insulating layer 140.

Holes M2H that partially expose an upper surface of the interlayer insulating layer 140 may be formed in the second mask pattern M2. The second mask pattern M2 may be formed of photoresist. Processes of forming the second mask pattern M2 in the interlayer insulating layer 140 will be schematically described. The second mask pattern M2 having the holes M2H is formed by coating a photoresist layer on the interlayer insulating layer 140 and patterning the photoresist layer through an exposing process and a developing process.

Referring to FIG. 3H, second insulating patterns 130P and 140P having the line pattern group holes 140H are formed so that parts of upper surfaces of the conductive plugs 120P are exposed by etching parts of the etch stop layer 130 (refer to FIG. 3G) and the interlayer insulating layer 140 (refer to FIG. 3G), using the second mask pattern M2 (refer to FIG. 3G) as an etch mask.

Parts of the second insulating patterns 130P and 140P are arranged in the centers of the conductive plugs 120P, and the other parts of the second insulating patterns 130P and 140P may be separate from the conductive plugs 120P at both ends.

After the line pattern group holes 140H are formed, the second mask patterns M2 (refer to FIG. 3G) may be removed by ashing and stripping processes.

In processes of manufacturing the interposer 10 (refer to FIG. 3N), various variables may be generated due to a characteristic of an etching process in correctly forming the second insulating patterns 130P and 140P having the line pattern group holes 140H so that the parts of the upper surfaces of the conductive plugs 120P are exposed.

Figure 4A:
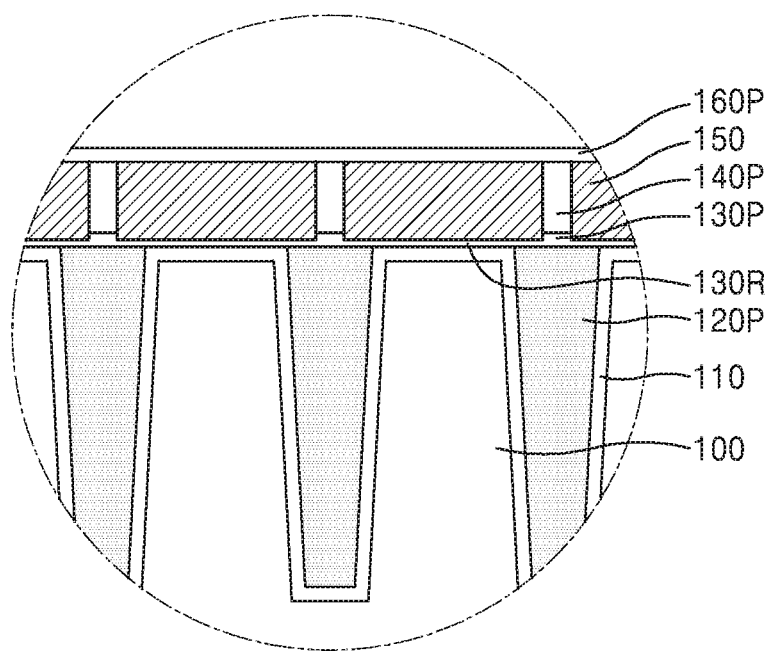
FIGS. 4A and 4B are views illustrating a structure of an interposer in which an electric open/short defect is generated among a substrate, a line pattern group, and a conductive plug.
Figure 4B:
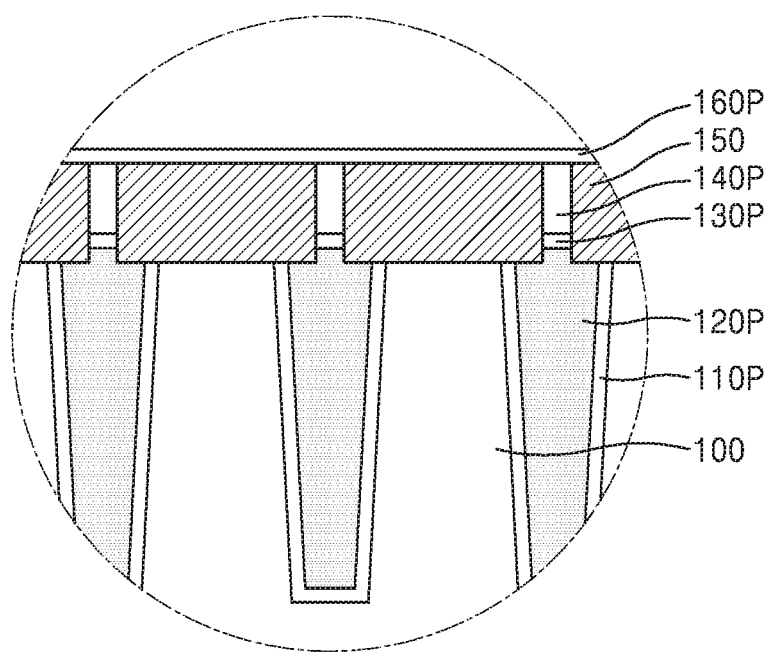

For example, as illustrated in FIG. 4A described below, a part of the etch stop layer 130 (refer to FIG. 3G) to be removed is left without being removed. Alternatively, as illustrated in FIG. 4B, not only the etch stop layer 130 (refer to FIG. 3G) but also the first insulating layer 110 to be left without being removed is removed so that the upper surface of the substrate 100 may be exposed.

Therefore, when the line pattern groups 150 (refer to FIG. 3I) are formed on the conductive plugs 120P, as illustrated in FIG. 4A, an electric open defect may be caused between the conductive plugs 120P and the line pattern groups 150 as illustrated in FIG. 4A. Also, an electric short defect may be caused between the substrate 100 and the line pattern groups 150 as illustrated in FIG. 4B.

Therefore, in the manufacturing processes of the interposer 10 (refer to FIG. 3N), after performing the etching process, a test for determining whether the etch stop layer 130 (refer to FIG. 3G) to be removed is completely removed and whether the first insulating layer 110 is etched so that the upper surface of the substrate 100 is exposed may be performed using measuring equipment.

Because the measuring equipment for performing the test is high-priced and it takes long to perform the test, manufacturing efficiency and economic feasibility of the interposer deteriorate. To solve the problem, the interposer 10 (refer to FIG. 3N) including the test structure 10T (refer to FIG. 2) may correctly detect an electric open/short defect within a short time by using the test structure 10T (refer to FIG. 2). Detailed testing method will be described below.

Referring to FIG. 3I, the line pattern groups 150 are formed in the line pattern group holes 140H (refer to FIG. 3H).

To form the line pattern groups 150, for example, after forming a second metal layer that fills the line pattern group holes 140H (refer to FIG. 3H), the second metal layer is polished by a CMP process or an etch-back process and using upper parts of the second insulating patterns 140P as stoppers. The CMP process or the etch back process may be performed so that the upper surfaces of the upper parts of the second insulating patterns 140P are exposed. As a result, the line pattern groups 150 may be formed in the line pattern group holes 140H (refer to FIG. 3H). The line pattern groups 150 may correspond to metal conductive lines of the mounting area MA (refer to FIG. 1) and/or the device area DA (refer to FIG. 1).

The line pattern groups 150 may include, for example, Cu. To form the line pattern groups 150, for example, after forming a Cu seed layer on side walls and lower surfaces of the line pattern group holes 140H (refer to FIG. 3H), a Cu layer is grown from the Cu seed layer by an electro-plating process, and a process of annealing a resultant material in which the Cu layer is formed may be performed.

An arrangement relationship between the line pattern groups 150 and the conductive plugs 120P is as follows. The conductive plugs 120P may be separate from each other in the first direction (the X direction) by the first distance 120X. The first distance 120X refers to a distance between the conductive plugs 120P on upper surfaces of the conductive plugs 120P.

The line pattern group 150 may be formed of the non-conductive space area 150S arranged in the center of the conductive plug 120P and the conductive pattern area 150P arranged by bridging peripheries of the two adjacent conductive plugs 120P. The non-conductive space area 150S may be an area defined between the two adjacent conductive pattern areas 150P. The non-conductive space area 150S is an area in which there is no conductive pattern area 150P.

The non-conductive space areas 150S and the conductive pattern areas 150P are alternately and repeatedly arranged in the first direction (the X direction), and the conductive pattern areas 150P and the conductive plugs 120P may be alternately and repeatedly arranged in the first direction (the X direction).

A length 150SL of the non-conductive space area 150S in the first direction (the X direction) may be less than a first diameter 120PL of the conductive plug 120P. The conductive plugs 120P are separate from each other by the first distance 120X. A length 150PL of the conductive pattern area 150P in the first direction (the X direction) is greater than the first distance 120X and may be less than the sum of the first distance 120X and the first diameter 120PL. A level of a lower surface of the conductive pattern area 150P may be the same as a level of an upper surface of the conductive plug 120P.

The first insulating layer 110 may be arranged at a side surface and on a lower surface of the conductive plug 120P. In addition, the second insulating patterns 130P and 140P formed of a material different from the first insulating layer 110 may be arranged in at least a part of the upper surface of the conductive plug 120P, for example, in the center of the conductive plug 120P. Here, the second insulating patterns 130P and 140P arranged in at least a part of the upper surface of the conductive plug 120P may fill the non-conductive space area 150S.

The line pattern group 150 having such a structure is not electrically connected only by the conductive pattern area 150P due to the non-conductive space area 150S. Therefore, the line pattern group 150 may be electrically connected through the conductive plug 120P.

Referring to FIG. 3J, a third insulating layer 160 that covers the second insulating patterns 130P and 140P and the line pattern groups 150 may be formed.

The third insulating layer 160 may be, for example, a material among a silicon oxide, a silicon nitride layer, a silicon oxynitride layer, and silicon carbide. The third insulating layer 160 may be formed of the same material as the etch stop layer 130 (refer to FIG. 3F). However, the inventive concept is not limited thereto.

The third insulating layer 160 may have enough thickness so that the line pattern groups 150 are not exposed to the outside.

Referring to FIG. 3K, a third mask pattern M3 is formed on the third insulating layer 160.

Holes M3H that expose parts of an upper surface of the third insulating layer 160 may be formed in the third mask pattern M3. The third mask pattern M3 may be formed of photoresist. Processes of forming the third mask pattern M3 on the third insulating layer 160 will be schematically described. The third mask pattern M3 having the holes M3H is formed by coating a photoresist layer on the third insulating layer 160 and patterning the photoresist layer through an exposing process and a developing process.

Referring to FIG. 3L, a third insulating pattern 160P including pad holes 160H is formed so that parts of upper surfaces of the line pattern groups 150 are exposed by etching parts of the third insulating layer 160 (refer to FIG. 3K), using the third mask pattern M3 (refer to FIG. 3K) as an etch mask.

The pad holes 160H may be arranged at both ends of the line pattern group 150. However, the inventive concept is not limited thereto. After forming the pad holes 160H, the third mask pattern M3 (refer to FIG. 3K) may be removed by ashing and stripping processes.

Referring to FIG. 3M, pads 155 that fill the pad holes 160H (refer to FIG. 3L) are formed.

The pads 155 may be formed of nickel (Ni), Cu, aluminum (Al), gold (Au), tungsten (W), or a combination of the above metals. However, the inventive concept is not limited thereto. The pads 155 may be electrically connected to both ends of the line pattern group 150. That is, the at least two pads 155 may be electrically connected to the line pattern group 150.

In other example embodiments, the pads 155 may not be formed, and parts of the both ends of the line pattern group 150, exposed from the third insulating pattern 160P, may function as the pads 155.

According to the inventive concept, it may be rapidly and correctly measured whether an electric open defect is generated between the conductive plug 120P and the line pattern group 150 and whether an electric short defect is generated between the substrate 100 and the line pattern group 150 by connecting a measuring apparatus to the pads 155.

Referring to FIG. 3N, the interposer 10 including the first and second line pattern groups L1 and L2 for connecting the conductive plugs 120P is illustrated.

The at least two line pattern groups 150 may be formed because the electric short defect between the substrate 100 and the line pattern groups 150 may be measured by the at least two line pattern groups, although the electric open defect between the conductive plug 120P and the line pattern group 150 may be measured by only one line pattern group 150.

Therefore, the first and second line pattern groups L1 and L2 having the non-conductive space area 150S arranged in the center of the conductive plug 120P and the conductive pattern area 150P arranged by bridging the peripheries of the two adjacent conductive plugs 120P may be arranged. In addition, the pads 155 electrically connected to the conductive pattern areas 150P at both ends of the first and second line pattern groups L1 and L2 may be arranged.

The first and second line pattern groups L1 and L2 have the same structure, are adjacent in parallel, and are physically/electrically isolated from each other. In example embodiments, the first and second line pattern groups L1 and L2 may have the same length in the first direction (the X direction). In other example embodiments, the first and second line pattern groups L1 and L2 may have different lengths in the first direction (the X direction)

The interposer 10 may include a test structure having the substrate 100, the first and second line pattern groups L1 and L2, the conductive plugs 120P, and the pads 155. In addition, the interposer 10 may further include a test structure that performs a different function from the test structure.

FIGS. 4A and 4B are views illustrating structures of an interposer in which electric open/short defects are generated among a substrate, a line pattern group, and a conductive plug.

Referring to FIG. 4A, a part of the etch stop layer 130 (refer to FIG. 3G) to be removed may be left as an etch residue 130R.

In a normal case, the line pattern group 150 is electrically connected through the conductive plug 120P. On the other hand, when the etch residue 130R is between the line pattern group 150 and the conductive plug 120P, the line pattern group 150 and the conductive plug 120P may be electrically isolated.

Therefore, when the line pattern group 150 is formed on the conductive plug 120P, the electric open defect may be caused between the conductive plug 120P and the line pattern group 150. In the etching process, a part of the etch stop layer 130 (refer to FIG. 3G) may be less etched so that the electric open defect may be caused. For example, the etch stop layer 130 (refer to FIG. 3G) and/or the interlayer insulating layer 140 (refer to FIG. 3G) is formed to have a thickness greater than a normal thickness, or the etch stop layer 130 (refer to FIG. 3G) is less etched to have a thickness less than a normal thickness, so that the electric open defect may be generated.

Referring to FIG. 4B, not only the etch stop layer 130 (refer to FIG. 3G) but also the first insulating layer 110 (refer to FIG. 3G) to be left without being removed is partially etched so that a first insulating pattern 110P is formed and an upper surface of the substrate 100 is exposed.

In a normal case, the substrate 100 is electrically isolated from the line pattern group 150 through the first insulating layer 110 (refer to FIG. 3G). On the other hand, when the first insulating layer 110 (refer to FIG. 3G) is not between the substrate 100 and the line pattern group 150, the substrate 100 and the line pattern group 150 are electrically connected.

Therefore, when the line pattern group 150 is formed on the conductive plug 120P, the electric short defect may be caused between the substrate 100 and the line pattern group 150. In the etching process, the first insulating layer 110 (refer to FIG. 3G) to be left without being removed is partially etched so that the electric short defect may be generated. For example, the etch stop layer 130 (refer to FIG. 3G) and/or the interlayer insulating layer 140 (refer to FIG. 3G) is formed to have a thickness greater than a normal thickness, or the first insulating layer 110 (refer to FIG. 3G) is less etched to have a thickness less than a normal thickness, so that the electric short defect may be generated.

Figure 5:
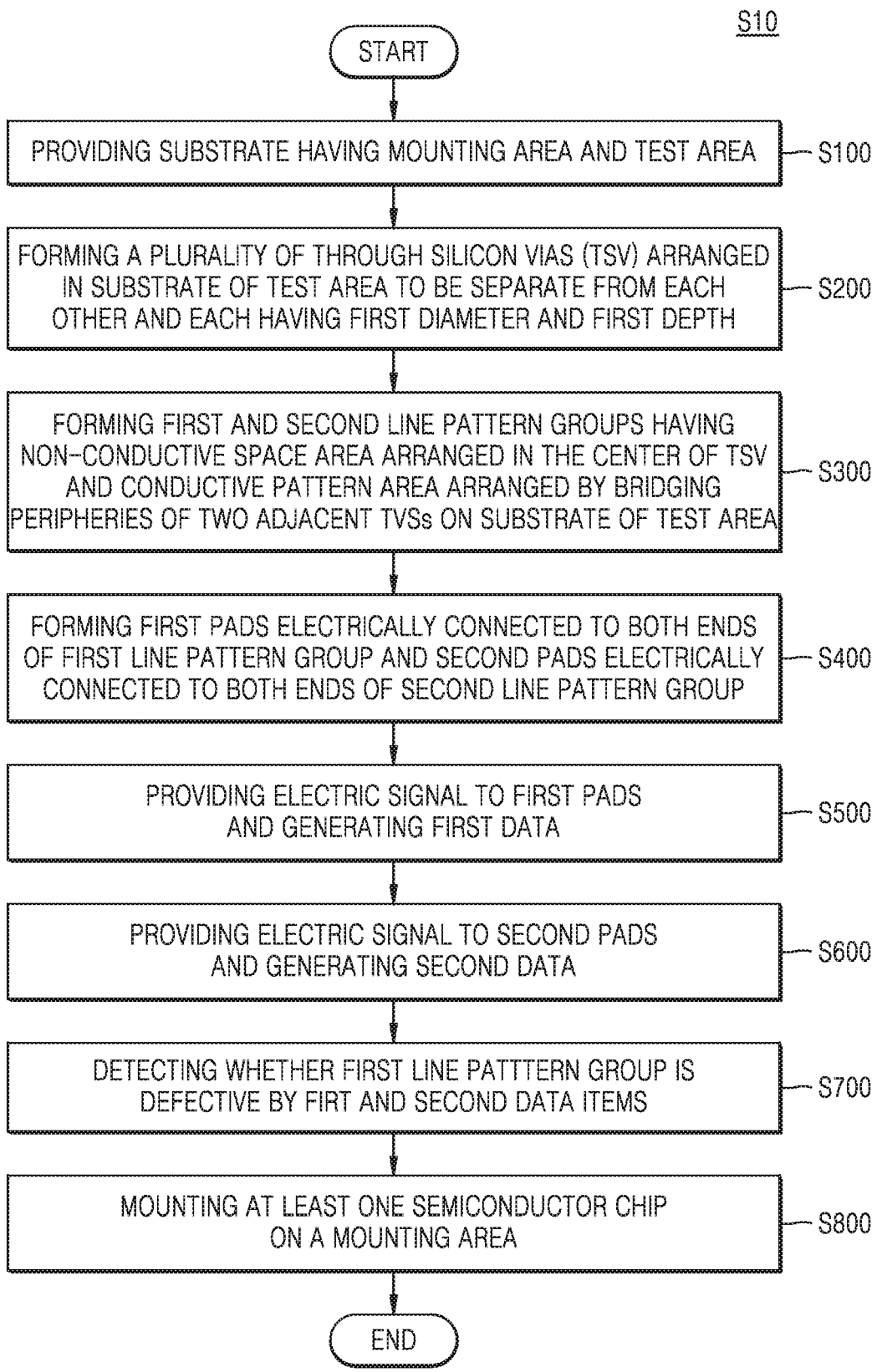
FIG. 5 is a flowchart illustrating a method of manufacturing a semiconductor package, according to example embodiments.

FIG. 5 is a flowchart illustrating a method of manufacturing a semiconductor package, according to example embodiments.

Referring to FIG. 5, a method S10 of manufacturing a semiconductor package includes operations of providing a substrate having a mounting area and a test area S100, forming a plurality of silicon through electrodes separate from each other and each having a first diameter and a first depth, in the substrate of the test area S200, and forming first and second line pattern groups including a non-conductive space area arranged in the center of a silicon through electrode and a conductive pattern area arranged by bridging peripheries of two adjacent silicon through electrodes S300. The method S10 further includes forming first pads electrically connected to both ends of the first line pattern group and second pads electrically connected to both ends of the second line pattern group S400, providing an electric signal to the first pads and generating first data S500, providing a measuring signal to the second pads and generating second data S600, detecting whether the first line pattern group is defective by the first and second data S700, and mounting at least one semiconductor chip on the mounting area S800.

Among the above operations, because the operations S100 to S400 are described in detail with reference to FIGS. 3A to 3N, description thereof will not be given for convenience sake.

In the operation S500, it is determined by the test structure 10T (refer to FIG. 2) whether the line pattern group 150 (refer to FIG. 2) and the conductive plug 120P (refer to FIG. 2) are electrically connected or isolated so that first data capable of determining whether there is an insulating layer between the line pattern group 150 (refer to FIG. 2) and the conductive plug 120P (refer to FIG. 2), which are defective, may be generated.

In the operation S600, it is determined by the test structure 10T (refer to FIG. 2) whether the substrate 100 (refer to FIG. 2) and the line pattern group 150 (refer to FIG. 2) are electrically connected or isolated so that second data capable of determining whether there is not an insulating layer between the substrate 100 (refer to FIG. 2) and the line pattern group 150 (refer to FIG. 2), which are defective, may be generated.

In the operation S700, the first and second data generated by the operations S500 and S600 are analyzed so that it is determined whether the interposer 10 (refer to FIG. 1) used for measurement includes a normal structure or a defective structure.

In the operation S800, subsequent processes are performed on the interposer including the normal structure, and at least one semiconductor chip 10C (refer to FIG. 1) may be mounted in the mounting area MA (refer to FIG. 1).

The subsequent processes may include a process of forming a re-interconnect layer on the upper surface of the substrate 100 (refer to FIG. 2), a process of grinding a lower surface of the substrate 100 (refer to FIG. 2) and exposing a silicon through electrode. All the processes of completing the interposer used for a semiconductor package may be included.

In a method of testing defect in the interposer, an optical test may find most of all kinds of defects. However, the optical test may not distinguish main defects that direct affect deterioration of yield. In addition, because measuring equipment used for the optical test tests the substrate by a scan method, it takes long and the measuring equipment is high-priced. Therefore, during the manufacturing processes of the interposer, the optical test may not be performed on the entire substrate. In addition, when the optical test is performed only on an area of the substrate, all the defects may not be detected so that there are limitations on increasing manufacturing yield. On the other hand, the interposer including the test structure according to the inventive concept may detect the electric open/short defects by using the test structure within a short time.

Figure 6:
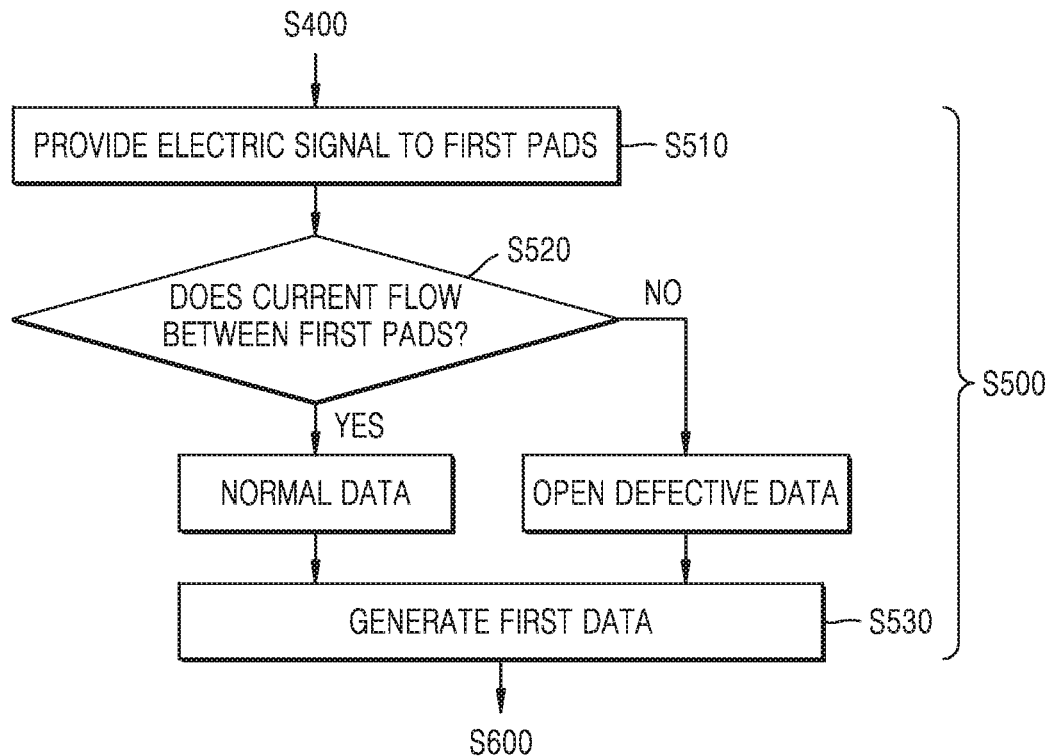
FIG. 6 is a flowchart illustrating a process of generating first data in detail in a method of manufacturing a semiconductor package, according to example embodiments.

FIG. 6 is a flowchart illustrating a process of generating first data in detail in a method of manufacturing a semiconductor package, according to example embodiments.

Referring to FIG. 6, the operation S500 of the method S10 (refer to FIG. 5) of manufacturing a semiconductor package includes operations of providing an electric signal to first pads electrically connected to the line pattern group 150 (refer to FIG. 2) S510, and determining whether current flow between the first pads S520, and generating first data S530. It is detected by the electric signal whether the electric defect exists in the line pattern group 150 (refer to FIG. 2) and the conductive plug 120P (refer to FIG. 2).

When the electric signal is provided to the first pads and current flow between the first pads, normal data may be generated as the first data with respect to the line pattern group 150 (refer to FIG. 2) and the conductive plug 120P (refer to FIG. 2).

When the electric signal is provided to the first pads and current does not flow between the first pads, open defective data may be generated as the first data with respect to the line pattern group 150 (refer to FIG. 2) and the conductive plug 120P (refer to FIG. 2).

Figure 7:
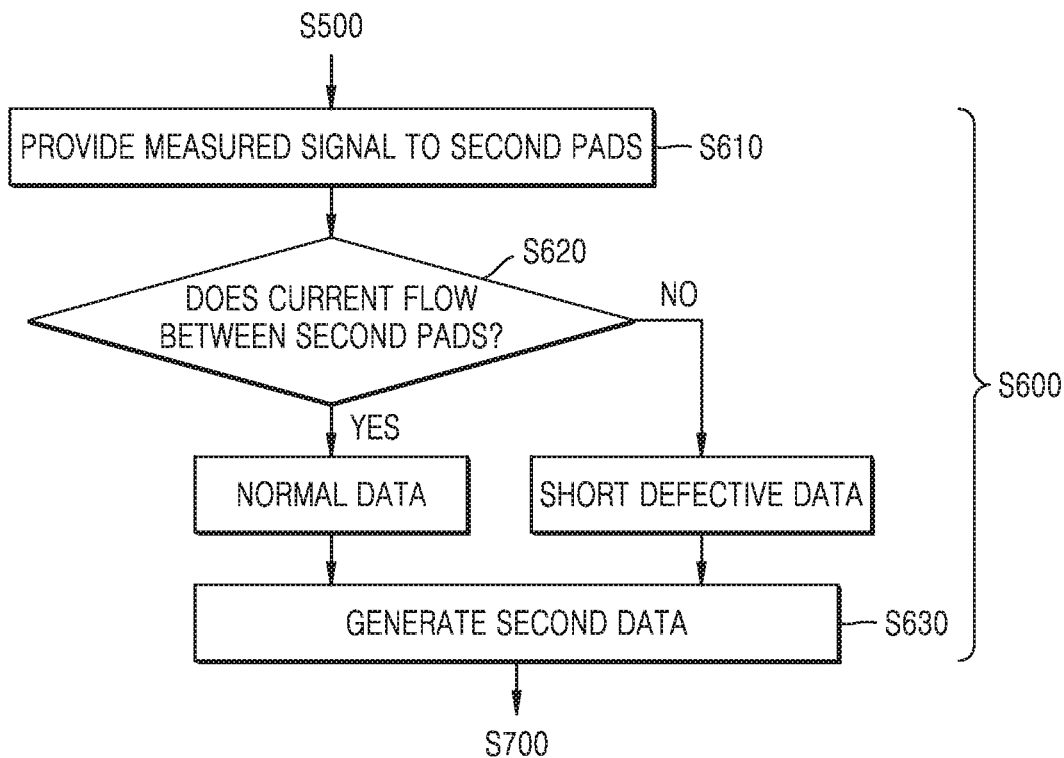
FIG. 7 is a flowchart illustrating a process of generating second data in detail in a method of manufacturing a semiconductor package, according to example embodiments.

FIG. 7 is a flowchart illustrating a process of generating second data in detail in a method of manufacturing a semiconductor package, according to example embodiments.

Referring to FIG. 7, in the method S10 (refer to FIG. 5) of manufacturing a semiconductor package, the operation S600 includes operations of providing a measuring signal to second pads electrically connected to a second line pattern group L2 (refer to FIG. 2) in a state of providing an electric signal to first pads electrically connected to a first line pattern group L1 (refer to FIG. 2) S610, determining whether current flows between the second pads S620, and generating second data S630.

It is determined by the measuring signal whether electric defect exists in the substrate 100 (refer to FIG. 2) and the first line pattern group L1 (refer to FIG. 2).

In the state in which the electric signal is provided to the first pads, when current flows between the first pads and current does not flow between the second pads to which the electric signal is not provided, normal data may be generated as the second data with respect to the substrate 100 (refer to FIG. 2) and the first line pattern group L1 (refer to FIG. 2).

To the contrary, in the state in which the electric signal is provided to the first pads, when current flows between the first pads and current flows between the second pads to which the electric signal is not provided, short defective data may be generated as the second data with respect to the substrate 100 (refer to FIG. 2) and the first line pattern group L1 (refer to FIG. 2).

Figure 8:
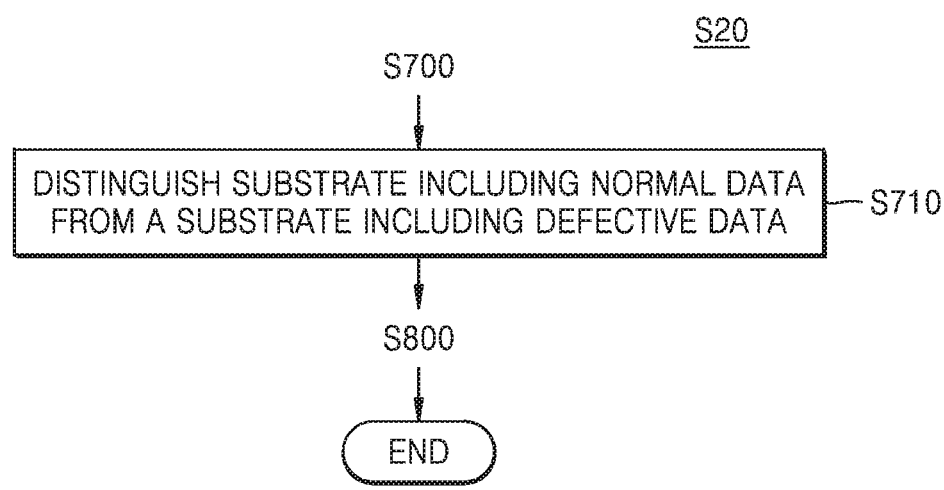
FIG. 8 is a flowchart illustrating a method of manufacturing a semiconductor package, according to example embodiments.

FIG. 8 is a flowchart illustrating a method of manufacturing a semiconductor package, according to example embodiments.

Referring to FIG. 8, a method S20 of manufacturing a semiconductor package, the method further including operation S710 of distinguishing a substrate including normal data from a substrate including defective data after the operation S700 of FIG. 5 is illustrated.

The interposer obtained by performing subsequent processes on a substrate in which first and second data items are normal may be used for manufacturing the semiconductor package. A substrate in which one of the first and second data items is defective is reworked or abandoned.

That is, according to the method S20 of manufacturing the semiconductor package, before performing a process of forming a re-interconnect layer on the substrate 100 (refer to FIG. 2), it is clearly grasped whether defect exists in the substrate, and the subsequent processes may be performed on the substrate 100 (refer to FIG. 2) including normal data. Accordingly, reliability and economic feasibility of the semiconductor package may be improved.

Figure 9:
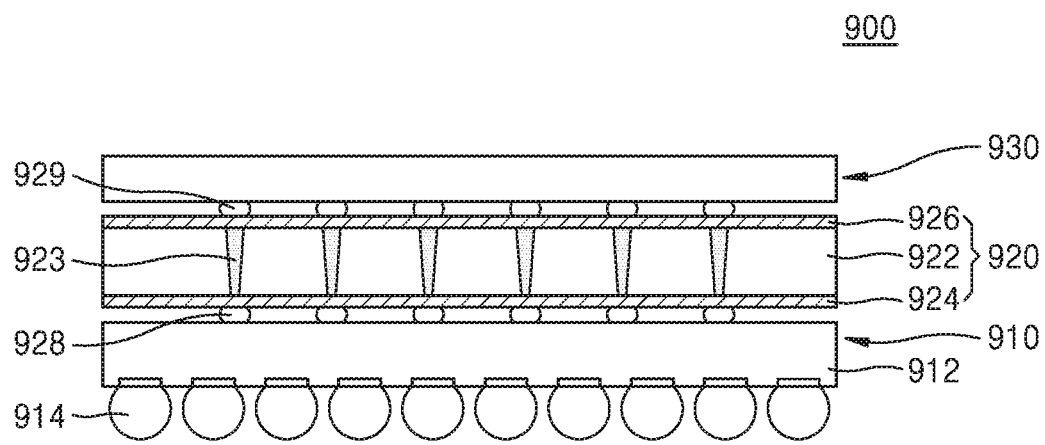
FIG. 9 is a cross-sectional view illustrating a semiconductor package manufactured by a method of manufacturing a semiconductor package, according to example embodiments.

FIG. 9 is a cross-sectional view illustrating a semiconductor package manufactured by a method of manufacturing a semiconductor package, according to example embodiments.

Referring to FIG. 9, a semiconductor package 900 formed of package on package (POP) in which a lower semiconductor package 910 and an upper semiconductor package 930 are flip chip bonded to an interposer 920 that adopts a silicon through electrode is illustrated.

The semiconductor package 900 includes the lower semiconductor package 910, the interposer 920 including a plurality of silicon through electrodes 923 therein, and the upper semiconductor package 930. The interposer 920 may be the interposer 10 (refer to FIG. 1).

A plurality of first connection terminals 914 are attached to a lower part of a substrate 912 of the lower semiconductor package 910. The plurality of first connection terminals 914 may be used for connecting the semiconductor package 900 to a main printed circuit board (PCB) of an electronic apparatus. In example embodiments, the plurality of first connection terminals 914 may be formed of solder balls or solder land.

The interposer 920 is used for implementing a vertical connection terminal for connecting the lower semiconductor package 910 and the upper semiconductor package 930 by a fine pitch. A plane size of a POP integrated circuit device may be reduced by adopting the interposer 920. The interposer 920 includes a silicon layer 922 through which the plurality of silicon through electrodes 923 pass and re-interconnect layers 924 and 926 formed on a lower surface and an upper surface of the silicon layer 922 to re-interconnecting the plurality of silicon through electrodes 923. In example embodiments, either one or both of re-interconnect layers 924 and 926 may be omitted.

On a lower surface of the interposer 920, a plurality of second connection terminals 928 for connecting the plurality of silicon through electrodes 923 to the substrate 912 of the lower semiconductor package 910 are formed. A plurality of third connection terminals 929 for connecting the plurality of silicon through electrodes 923 to an upper semiconductor package 930 are formed on an upper surface of the interposer 920. In example embodiments, the second connection terminals 928 and the third connection terminals 929 are formed of solder bumps or solder land.

When the semiconductor package 900 is used for a mobile telephone, the lower semiconductor package 910 may be a logic device such as a processor and the upper semiconductor package 930 may be a memory device. In example embodiments, the upper semiconductor package 930 may be a multi-chip package in which a plurality of semiconductor chips is laminated and an upper part of the upper semiconductor package 930 may be sealed up by an encapsulation member.

Figure 10:
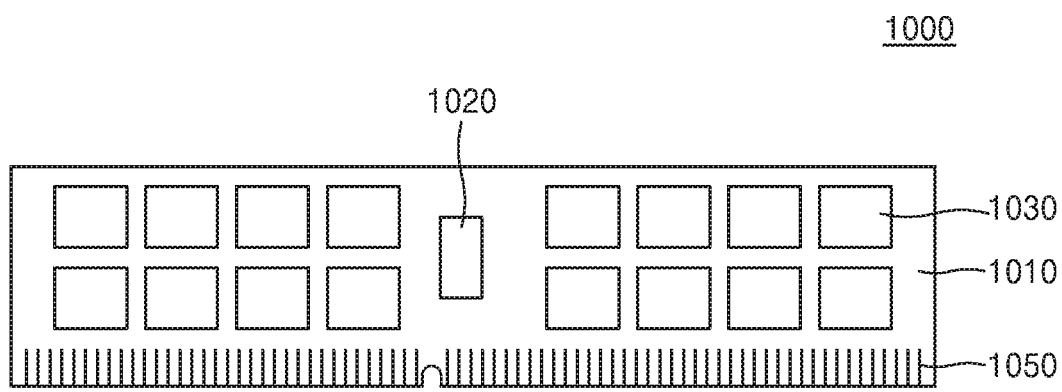
FIG. 10 is a plan view illustrating a semiconductor module including a semiconductor package manufactured by a method of manufacturing a semiconductor package, according to example embodiments.

FIG. 10 is a plan view illustrating a semiconductor module including a semiconductor package manufactured by a method of manufacturing a semiconductor package, according to example embodiments.

Referring to FIG. 10, a semiconductor module 1000 includes a module substrate 1010, a control chip 1020 mounted on the module substrate 1010, and a plurality of semiconductor packages 1030 mounted on the module substrate 1010.

At one side of the module substrate 1010, a plurality of input and output terminals 1050 that may be inserted into a socket of a main board. The plurality of semiconductor packages 1030 may include the interposer 10 (refer to FIG. 1). In addition, the plurality of semiconductor packages 1030 may be manufactured by the method S10 or S20 of manufacturing the semiconductor package.

Figure 11:
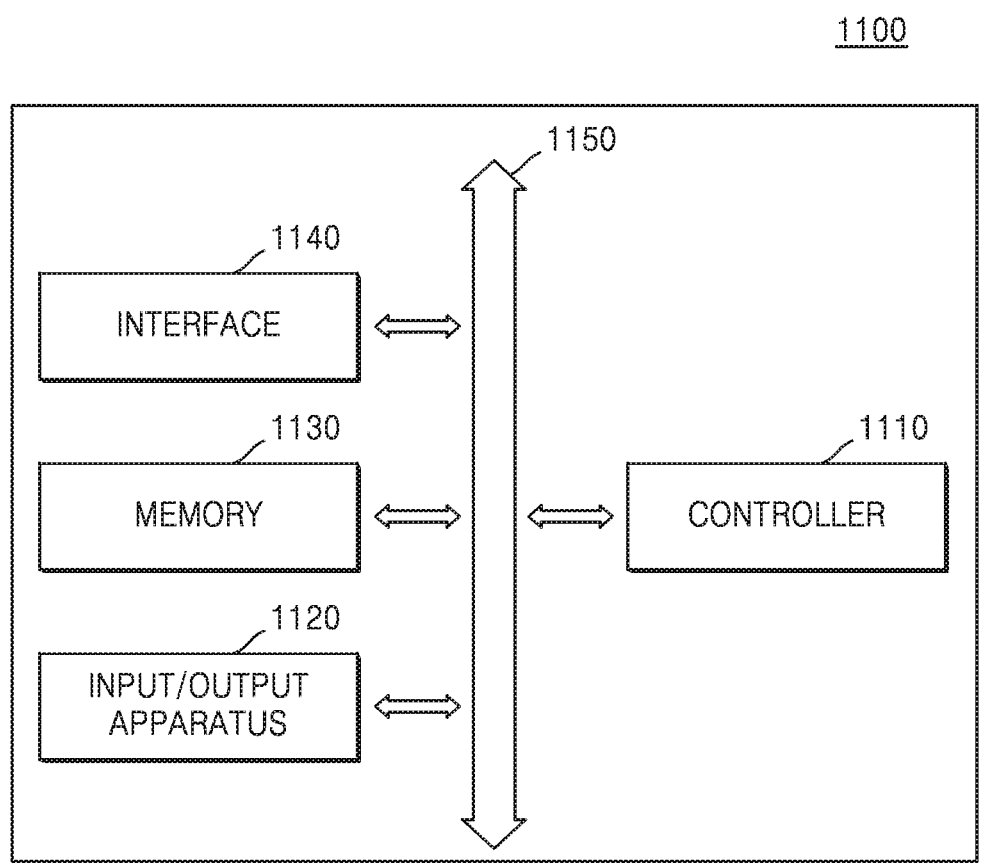
FIG. 11 is a block diagram illustrating a system of a semiconductor package manufactured by a method of manufacturing a semiconductor package, according to example embodiments.

FIG. 11 is a block diagram illustrating a system of a semiconductor package manufactured by a method of manufacturing a semiconductor package, according to example embodiments.

Referring to FIG. 11, a system 1100 includes a controller 1110, an input/output apparatus 1120, a memory 1130, an interface 1140, and a bus 1150.

The system 1100 may be a mobile system or a system for transmitting or receiving information. In example embodiments, the mobile system may be a portable computer, a web tablet, a mobile phone, a digital music player, or a memory card.

The controller 1110 for controlling an execution program in the system 1100 may be formed of a microprocessor, a digital signal processor, a microcontroller, or an apparatus similar to the above apparatuses.

The input/output apparatus 1120 may be used for inputting or outputting data of the system 1100. The system 1100 is connected to an external apparatus, for example, a personal computer (PC) or a network and may exchange data with the external apparatus. The input/output apparatus 1120 may be, for example, a touch pad, a keyboard, or a display device.

The memory 1130 stores data for operation of the controller 1110 or may store the data processed by the controller 1110. The memory 1130 may be a semiconductor package including the interposer 10 (refer to FIG. 1). In addition, the memory 1130 may be manufactured by the method (S10 or S20) of manufacturing the semiconductor package.

The interface 1140 may be a data transmission path between the system 1100 and the external apparatus. The controller 1110, the input/output apparatus 1120, the memory 1130, and the interface 1140 may communicate with each other through the bus 1150.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While the inventive concept has been shown and described with reference to example embodiments thereof, it will be understood that various changes in form and details may be made therein without departing from the spirit and scope of the following claims.

What is claimed is:

1. An interposer comprising:
a substrate having a mounting area and a test area;
first conductive plugs separate from each other, the first conductive plugs being disposed along a first direction and into the test area of the substrate;
a first line pattern group comprising first non-conductive patterns disposed on first centers of the first conductive plugs, and first conductive patterns disposed to bridge first peripheries of a first adjacent pair of the first conductive plugs;
first pads connected to the first conductive patterns at both first ends of the first line pattern group; and
a first insulating layer disposed on a side surface and on a lower surface of the first conductive plugs,
wherein the first non-conductive pattern comprises a second insulating layer disposed on a part of an upper surface of the first conductive plugs and comprising a first material different from a second material of the first insulating layer.

2. The interposer of claim 1, wherein the first non-conductive patterns and the first conductive patterns are alternately and repeatedly disposed along the first direction, and
wherein the first conductive patterns and the first conductive plugs are alternately and repeatedly disposed along the first direction.

3. The interposer of claim 1, wherein a length of each of the first non-conductive patterns in the first direction is less than a diameter of each of the first conductive plugs.

4. The interposer of claim 1, wherein the first conductive plugs are separate from each other by a distance, and
wherein a length of each of the first conductive patterns in the first direction is greater than the distance and is less than a sum of the distance and a diameter of each of the first conductive plugs.

5. The interposer of claim 1, wherein a first level of a lower surface of the first conductive patterns is same as a second level of the upper surface of the first conductive plugs.

6. The interposer of claim 1, wherein the second insulating layer has a multilayer structure of different materials.

7. The interposer of claim 1, further comprising through silicon vias (TSVs) disposed in the mounting area and having a first shape same as a second shape of the first conductive plugs.

8. The interposer of claim 7, further comprising a semiconductor chip disposed on the mounting area and connected to the TSVs.

9. The interposer of claim 1, wherein the substrate further has a device area, and
wherein the interposer further comprises a semiconductor device disposed on the device area.

10. The interposer of claim 1, further comprising:
second conductive plugs separate from each other by a uniform distance, the second conductive plugs being disposed along the first direction and into the test area of the substrate, and the second conductive plugs being disposed apart from the first conductive plugs in a second direction perpendicular to the first direction;
a second line pattern group comprising second non-conductive patterns disposed on second centers of the second conductive plugs, and second conductive patterns disposed to bridge second peripheries of a second adjacent pair of the second conductive plugs; and
second pads connected to the second conductive patterns at both second ends of the second line pattern group.

11. The interposer of claim 10, wherein the first line pattern group and the second line pattern group have a same structure, are adjacent and parallel to each other, and are physically separate from each other.

12. The interposer of claim 10, wherein the first line pattern group and the second line pattern group have a same length in the first direction.

13. The interposer of claim 10, further comprising a third insulating layer disposed to cover first upper surfaces of the first line pattern group and the second line pattern group,
wherein second upper surfaces of the first pads and the second pads are exposed to an outside.

14. The interposer of claim 13, wherein the first pads contact a first apparatus for testing first open defects between the first line pattern group and the first conductive plugs,
wherein the second pads contact a second apparatus for testing second open defects between the second line pattern group and the second conductive plugs, and wherein the first pads and the second pads contact a third apparatus for testing short defects between the first line pattern group and the second line pattern group and the substrate.

15. An interposer comprising:

a substrate having a mounting area and a test area;

first conductive plugs separate from each other, the first conductive plugs being disposed along a first direction and into the test area of the substrate;

a first line pattern group comprising first non-conductive patterns disposed on first centers of the first conductive plugs, and first conductive patterns disposed on the first conductive plugs and directly between the first non-conductive patterns;

first pads disposed on both first ends of the first line pattern group;

second conductive plugs separate from each other, the second conductive plugs being disposed along the first direction and into the test area of the substrate, and the second conductive plugs being disposed apart from the first conductive plugs in a second direction perpendicular to the first direction;

a second line pattern group comprising second non-conductive patterns disposed on second centers of the second conductive plugs, and second conductive patterns disposed on the second conductive plugs and directly between the second non-conductive patterns; and second pads disposed on both second ends of the second line pattern group.

16. The interposer of claim 15, wherein a length of each of the first non-conductive patterns in the first direction is less than a diameter of each of the first conductive plugs.

17. The interposer of claim 15, wherein the first conductive plugs are separate from each other by a distance, and wherein a length of each of the first conductive patterns in the first direction is greater than the distance and is less than a sum of the distance and a diameter of each of the first conductive plugs.

18. The interposer of claim 15, wherein the first line pattern group and the second line pattern group have a same structure.

19. The interposer of claim 15, further comprising through silicon vias disposed into the mounting area of the substrate and having a first shape same as a second shape of the first conductive plugs.

* * * * *